(12) United States Patent
Taylor, Jr. et al.

(10) Patent No.: US 7,910,442 B2
(45) Date of Patent: Mar. 22, 2011

(54) PROCESS FOR MAKING A SEMICONDUCTOR DEVICE USING PARTIAL ETCHING

(75) Inventors: William J. Taylor, Jr., Round Rock, TX (US); Cristiano Capasso, Austin, TX (US); Srikanth B. Samavedam, Fishkill, NY (US); James K. Schaeffer, Wappingers Falls, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 261 days.

(21) Appl. No.: 11/782,319

(22) Filed: Jul. 24, 2007

(65) Prior Publication Data

US 2009/0029538 A1    Jan. 29, 2009

(51) Int. Cl.
*H01L 21/8234* (2006.01)
(52) U.S. Cl. .. 438/275; 438/706; 438/745; 257/E21.396
(58) Field of Classification Search .................. 438/706, 438/745, 746, 785, 275; 257/E21.396
See application file for complete search history.

(56) References Cited

U.S. PATENT DOCUMENTS

| 6,444,512 | B1 | 9/2002 | Madhukar et al. | |
| 6,545,324 | B2 | 4/2003 | Madhukar et al. | |
| 7,494,859 | B2 * | 2/2009 | Cho et al. | 438/199 |
| 2005/0101113 | A1 * | 5/2005 | Brask et al. | 438/585 |
| 2007/0052037 | A1 * | 3/2007 | Luan | 257/369 |

FOREIGN PATENT DOCUMENTS

WO    2005048334 A1    5/2005

OTHER PUBLICATIONS

S.B. Samavedam, et al., "Dual-Metal Gate CMOS with HfO2 Gate Dielectric," Electron Devices Meeting, 2002. IEDM '02. Digest. International Dec. 8-11, 2002 pp. 433-436.
S.C. Song, et al., "Highly Manufacturable 45nm LSTP CMOSFETs Using Movel Dual High-k and Dual Metal Gate CMOS Integration," Symposium on VLSI Technology Digest of Technical Papers, 2006.

\* cited by examiner

*Primary Examiner* — Bradley K Smith (57) ABSTRACT

A method including partially etching a first portion of a first layer, wherein the first layer is a conductive layer, is provided. The method further includes removing at least a portion of a second layer. The method further includes completing etching of said first portion of the conductive layer so that said first portion of the conductive layer is removed. The method further includes completing formation of the semiconductor device.

20 Claims, 9 Drawing Sheets

PROCESS FOR MAKING A SEMICONDUCTOR DEVICE USING PARTIAL ETCHING

BACKGROUND

1. Field

This disclosure relates generally to methods of making semiconductor devices, and more specifically, to a process for making a semiconductor device using partial etching.

2. Related Art

High speed semiconductor devices require higher gate capacitance. Higher gate capacitance has been achieved in semiconductor devices with silicon-oxide gate dielectric layers by thinning the gate dielectric layer. Thinner gate dielectric layer, however, results in leakage across the thin dielectric layer. To address this problem, increasingly, semiconductor devices have high-k dielectric layers, which can have sufficient thickness to reduce gate leakage and yet maintain sufficiently high gate capacitance.

In fabricating dual metal gate devices, typically the first metal layer is covered with a hard mask layer, patterned, and etched down to the gate dielectric layer. Next, the photo resist and the hard mask layer are removed and a second metal layer is deposited. When the hard mask layer is removed, however, the removal of the hard mask layer can damage the gate dielectric layer. In particular, the exposure of the gate dielectric layer to the removal chemistry used for removing the hard mask layer can damage the gate dielectric layer. Similarly, the removal of photo resist can damage any exposed dielectric layer or any exposed metal layer.

Accordingly, there is a need for a process for making a semiconductor device using partial etching.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a method for forming semiconductor device, including partially etching a first portion of a first layer, wherein the first layer is a conductive layer, is provided. The method further includes removing at least a portion of a second layer. The method further includes completing etching of said first portion of the conductive layer so that said first portion of the conductive layer is removed. The method further includes completing formation of the semiconductor device.

In another aspect, a method for forming a semiconductor device, including forming a first conductive layer, where the first conductive layer has a first portion and a second portion, is provided. The method further includes forming a hard mask overlying the second portion of the first conductive layer. The method further includes partially etching the first portion of the first conductive layer which is exposed through the hard mask. The method further includes removing at least a portion of the hard mask and completing etching of the first portion of the conductive layer so that said first portion of the conductive layer is removed. The method further includes forming a second conductive layer, wherein at least a portion of the second conductive layer is used in a gate stack of the semiconductor device. The method further includes completing formation of the semiconductor device.

In yet another aspect, a method for forming a semiconductor device, including partially etching the first portion of a hard mask layer, is provided. The method further includes removing at least a portion of a second layer. The method further includes completing etching of said first portion of the hard mask layer so that said first portion of the hard mask layer is removed and completing formation of the semiconductor device.

In still another aspect, a method for forming a semiconductor device, including forming a conductive layer, is provided. The method further includes forming a hard mask layer overlying at least a portion of the conductive layer, wherein the hard mask layer has a first portion and a second portion. The method further includes forming a photo resist layer overlying the second portion of the hard mask layer. The method further includes partially etching the first portion of the hard mask layer which is exposed through the photo resist layer. The method further includes removing at least a portion of the photo resist layer. The method further includes completing etching of said first portion of the hard mask layer so that said first portion of the hard mask layer is removed. The method further includes etching a portion of the conductive layer. The method further includes completing formation of the semiconductor device.

Figure 1:
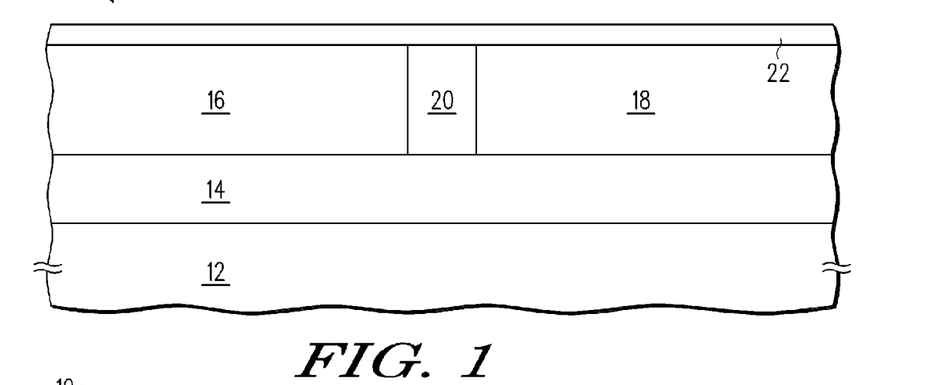
FIG. 1 is a view of a semiconductor device during a processing stage.

FIG. 1 shows a view of a semiconductor device 10 during a processing step. Semiconductor device 10 may comprise a device formed using semiconductor material on a buried oxide layer (BOX) 14, over a substrate 12. In an alternative embodiment, the semiconductor material may be part of substrate 12 and semiconductor device 10 may not include BOX 14. The semiconductor material described herein can be any semiconductor material or combinations of materials, such as gallium arsenide, silicon germanium, silicon, the like, and combinations of the above. Semiconductor device 10 may further comprise a first semiconductor layer 16 and a second semiconductor layer 18. First semiconductor layer 16 may be doped to form a p-type layer and second semiconductor layer 18 to form an n-type layer. First and second semiconductor layers 16 and 18 may be separated from each other using an isolation region 20. As a first step, a dielectric layer 22 may be formed over first semiconductor layer 16 and second semiconductor layer 18. Dielectric layer 22 may be deposited using a chemical vapor deposition or a physical vapor deposition process. Dielectric layer 22 may be a high-k dielectric layer formed using oxides of hafnium, aluminum, molybdenum, titanium, tantalum, zirconium, silicon, or any other suitable element. Dielectric layer 22 may also be a thermally grown or a deposited silicon oxide layer. Dielectric layer 22 may also contain nitrogen. Dielectric layer 22 may also be a combination of a deposited silicon oxide layer and a deposited high-K dielectric layer. Dielectric layer 22 may have a thickness in a range of 0.5 to 5 nanometers.

Figure 2:
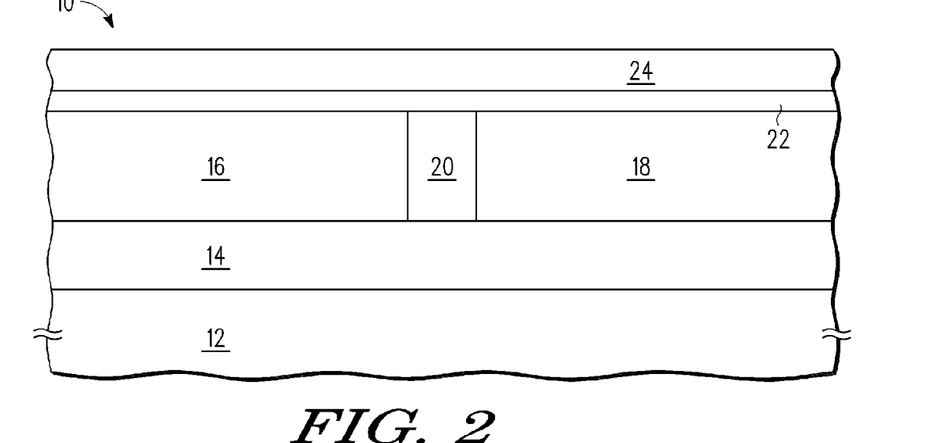
FIG. 2 is a view of a semiconductor device during a processing step.

Next, as shown in FIG. 2, a first metal layer 24 may be formed over dielectric layer 22. First metal layer 24 may comprise tantalum, titanium, molybdenum, aluminum, magnesium, or any other suitable material. By way of example, first metal layer 24 may be a compound of any of these elements and nitrogen, carbon, or boron. First metal layer 24 may be deposited using a chemical vapor deposition or a physical vapor deposition process. First metal layer 24 may have a thickness in a range of 1 to 20 nanometers. First metal layer 24 may have a work function near the silicon conduction band edge.

Figure 3:
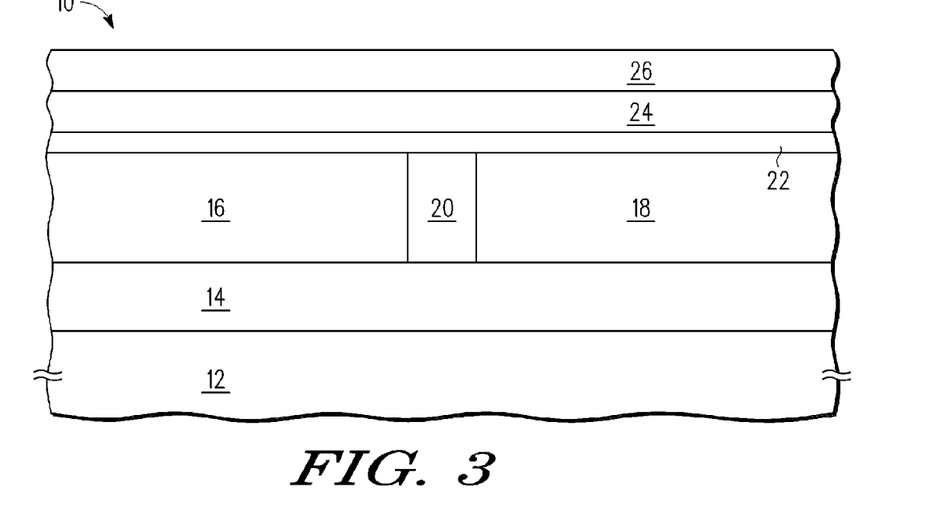
FIG. 3 is a view of a semiconductor device during a processing step.

Next, as shown in FIG. 3, a hard mask layer 26 may be formed over first metal layer 24. Hard mask layer 26 may comprise silicon, silicon nitride, silicon oxide, metal, or any other suitable material. Hard mask layer 26 may be deposited using a chemical vapor deposition or a physical vapor deposition process. Hard mask layer 26 may have a thickness in a range of 1 to 20 nanometers.

Figure 4:
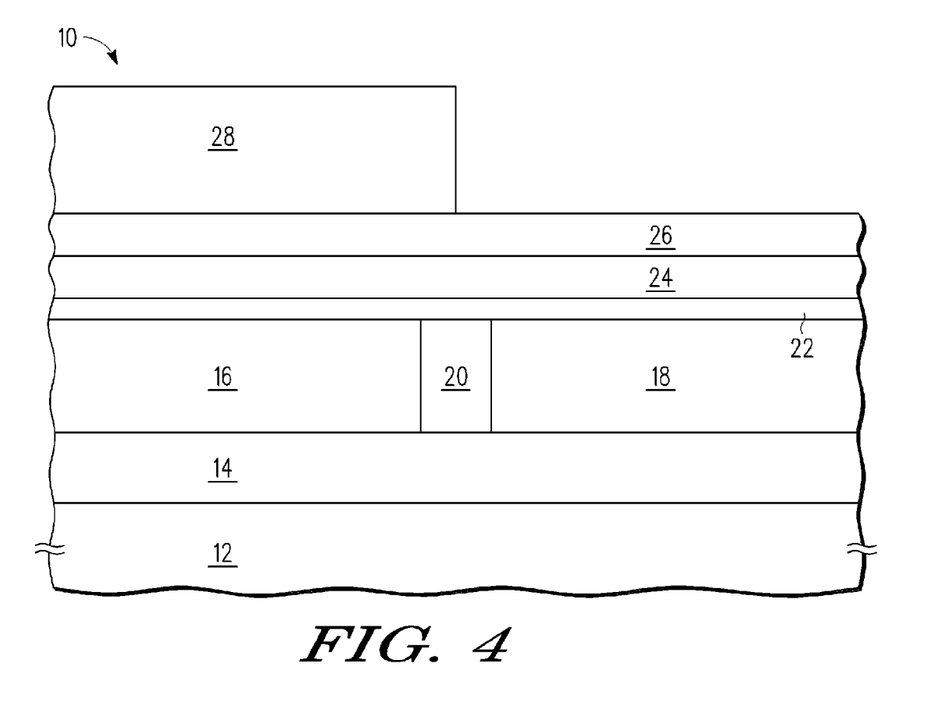
FIG. 4 is a view of a semiconductor device during a processing step.

Next, as shown in FIG. 4, a photo resist layer 28 may be formed over a portion of hard mask layer 26. By way of example, photo resist layer 28 may cover an n-type device region only.

Figure 5:
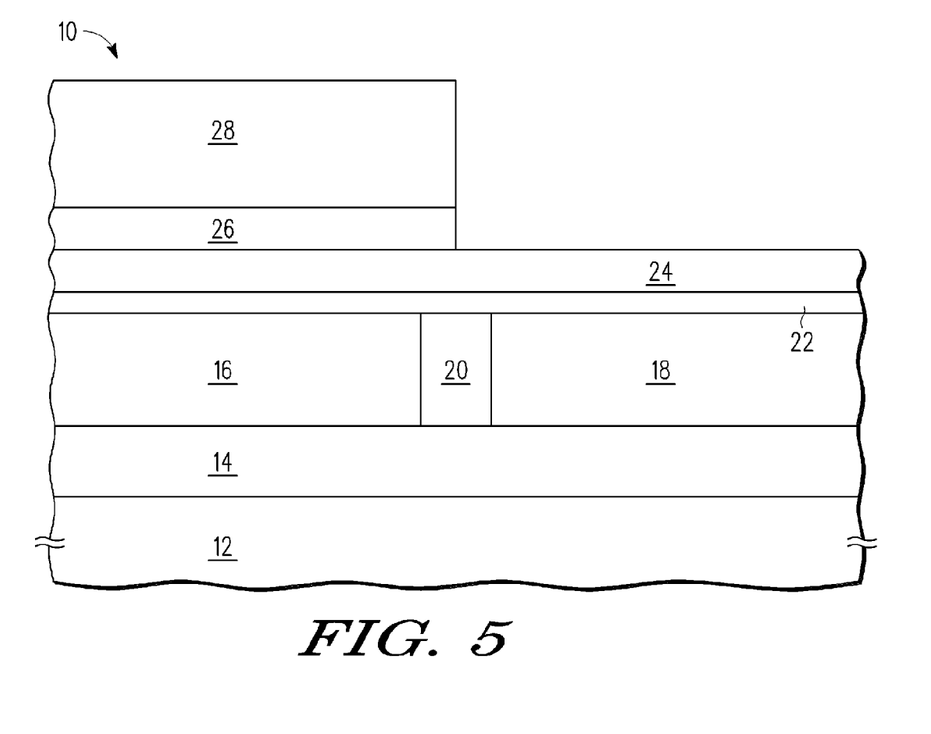
FIG. 5 is a view of a semiconductor device during a processing step.

Next, as shown in FIG. 5, a portion of hard mask layer 26, which is not protected by photo resist layer 28, may be removed. The portion of hard mask layer 26 may be removed by etching the hard mask layer 26. Wet or dry etching may be used as part of this step.

Figure 6:
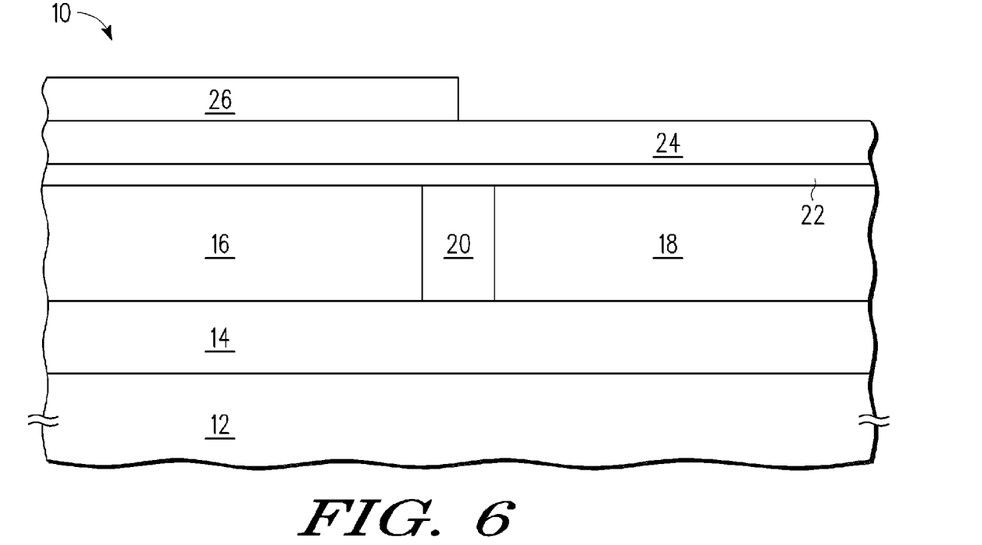
FIG. 6 is a view of a semiconductor device during a processing step.

Next, as shown in FIG. 6, photo resist layer 28 may be removed using either a wet etch or an ash etch process. This would expose hard mask layer 26.

Figure 7:
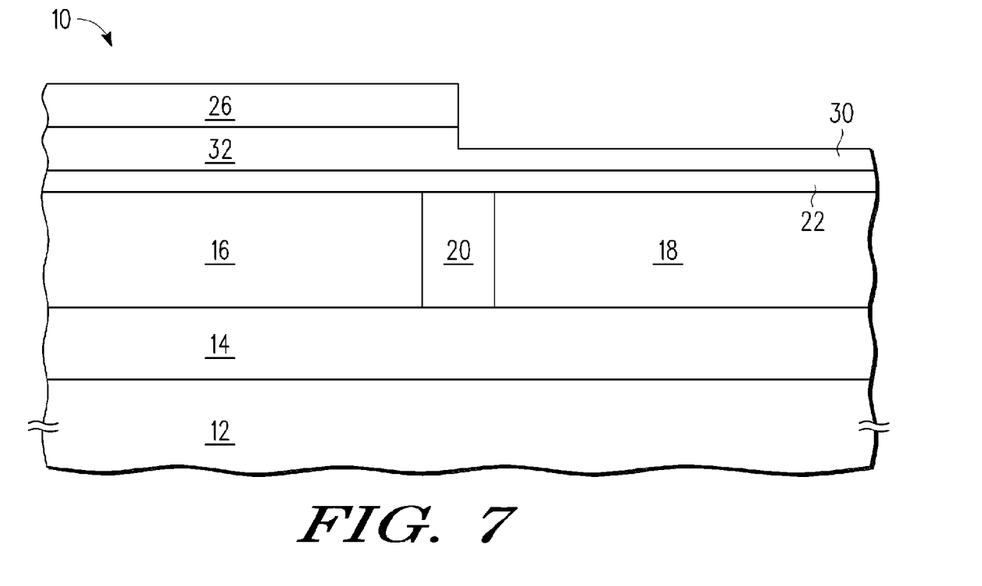
FIG. 7 is a view of a semiconductor device during a processing step.

Next, as shown in FIG. 7, a portion of first metal layer 24 may be etched away leaving a portion 30 and an un-etched portion 32 protected by hard mask layer 26. This partial etching may be achieved using a wet or dry etch process. First metal layer 24 may be removed using a solution of sulphuric acid and hydrogen peroxide for titanium or molybdenum containing first metal layer 24. First metal layer 24 may be removed using a solution of ammonium hydroxide and hydrogen peroxide for tantalum containing first metal layer 24.

Figure 8:
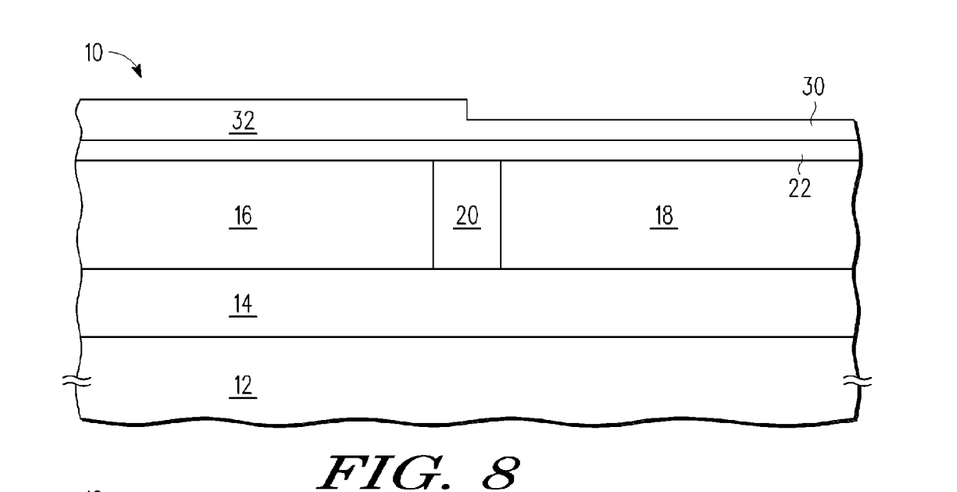
FIG. 8 is a view of a semiconductor device during a processing step.

Next, as shown in FIG. 8, hard mask layer 26 may be removed using a wet or dry etch process. Portion 30 of first metal layer 24, which is still in place, protects underlying dielectric layer 22 during this etch. In the absence of portion 30, dielectric layer 22 can be damaged by the etch process used to remove hard mask layer 26. Thus, the presence of portion 30 of first metal layer prevents dielectric layer 22 from being exposed to hard mask layer 26 removal chemistry. Note that hard mask layer 26 may not be completely removed or may not be removed at all in the n-type device region.

In an alternative embodiment, subsequent to the processing stage of semiconductor device 10 shown in FIG. 2, photo resist layer 28 may be formed over n-type device region overlying first metal layer 24. Next, first metal layer 24 may be partially etched using a wet or dry etch process. This would result in an un-etched portion 32 of first metal layer 24 and portion 30 of first metal layer 24. Photo resist layer 28 may then be removed using a wet or dry etch process. This would result in the processing stage of semiconductor device 10 shown in FIG. 8.

Figure 9:
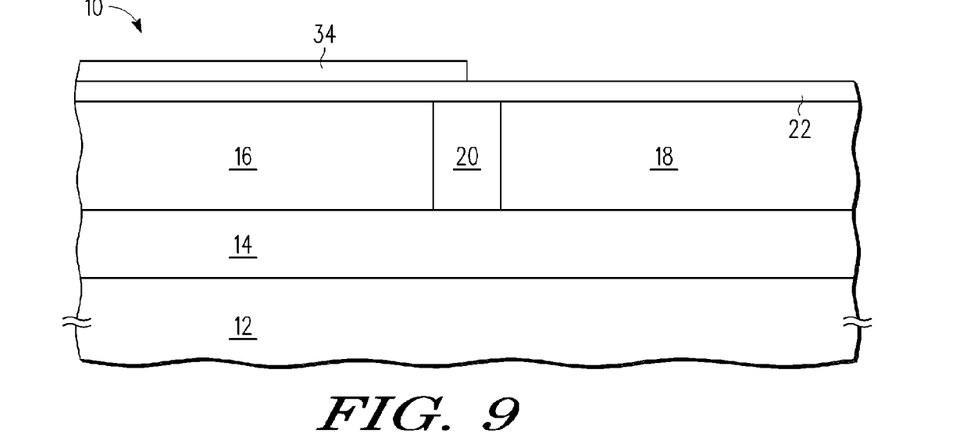
FIG. 9 is a view of a semiconductor device during a processing step.

Next, as shown in FIG. 9, portion 30 of first metal layer 24 may be etched away. This process may also remove a part of un-etched portion 32 of first metal layer, leaving portion 34 of first metal layer 24, overlying dielectric layer 22 only in a region of semiconductor device 10. By way of example, portion 34 may overlie dielectric layer 22 in an n-type region of semiconductor device 10.

Figure 10:
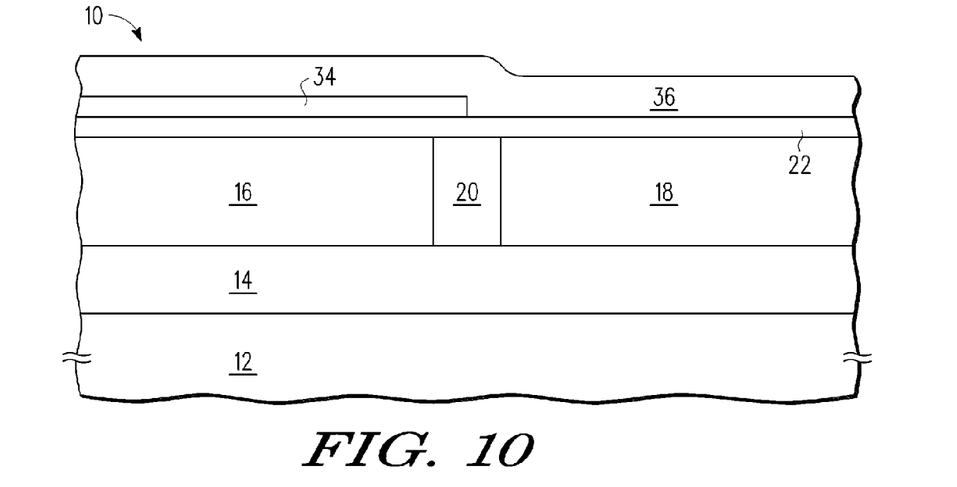
FIG. 10 is a view of a semiconductor device during a processing step.

Next, as shown in FIG. 10, a second metal layer 36 may be formed over portion 34 and an exposed portion of dielectric layer 22. Second metal layer 36 may comprise tantalum, titanium, molybdenum, aluminum, or any other suitable material. By way of example, second metal layer 36 may be a compound of any of these elements and nitrogen, carbon, oxygen, or boron. Second metal layer 36 may be deposited using a chemical vapor deposition or a physical vapor deposition process. Second metal layer 36 may have a thickness in a range of 1 to 20 nanometers. Second metal layer 36 may have a work function near the silicon valence band edge.

Figure 11:
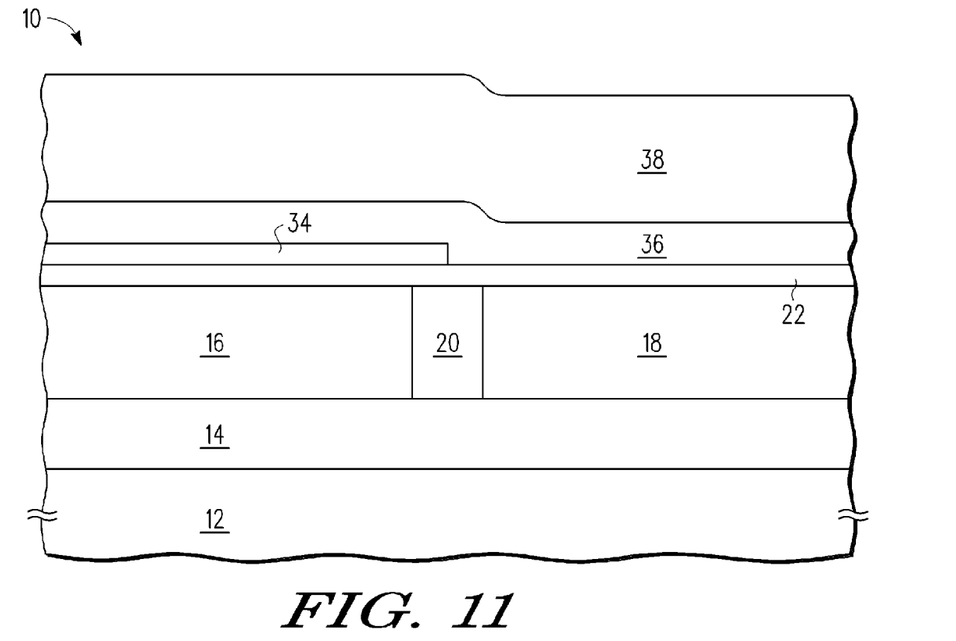
FIG. 11 is a view of a semiconductor device during a processing step.

Next, as shown in FIG. 11, a crystalline (poly) silicon layer 38 may be deposited over second metal layer 36. Crystalline silicon layer 38 may be deposited using a chemical vapor deposition or a physical vapor deposition process. In an alternative embodiment, crystalline silicon layer 38 may be an amorphous silicon layer. Crystalline silicon layer 38 may have a thickness in a range of 50 to 100 nanometers.

Figure 12:
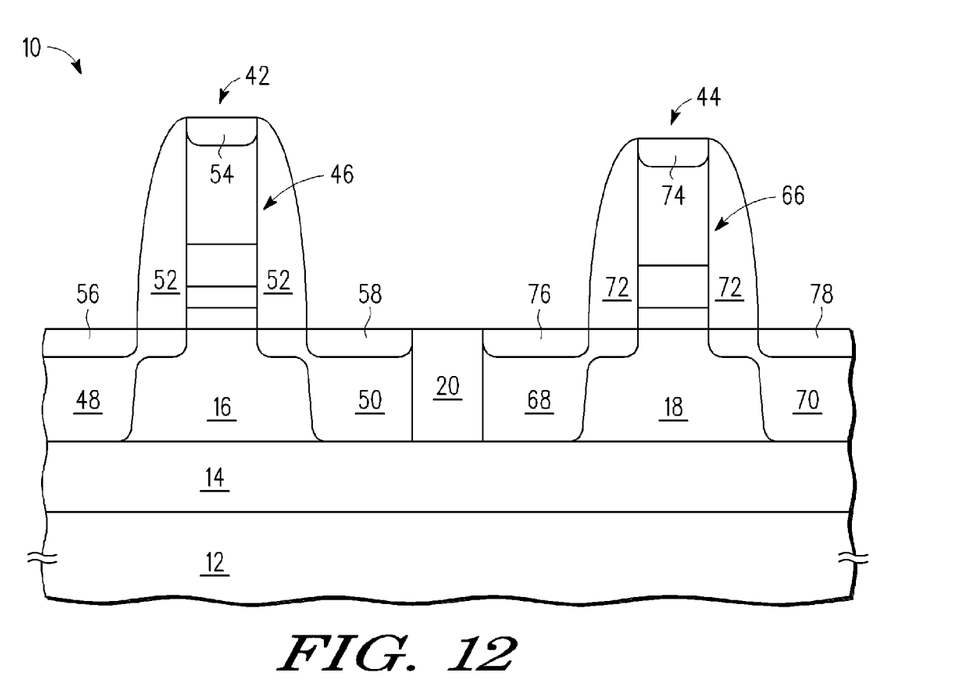
FIG. 12 is a view of a semiconductor device during a processing step.

Next, as shown in FIG. 12, additional processing steps may be performed, as needed, to form semiconductor device 10. By way of example, gate stacks 46 and 66 may be formed. Gate stack 46 may correspond to an n-type device and gate stack 66 may correspond to a p-type device. The conductivity type of these devices is merely exemplary. Next, source/drain extensions 56 and 58 for the n-type device may be formed. Next, a spacer 52 adjacent to gate stack 46 may be formed. Next, source/drain 48 and 50 may be formed and finally silicide regions 54, 56, and 58 may be formed. Similarly, source/drain extensions 76 and 78 for the p-type device may be formed. Next, a spacer 72 adjacent to gate stack 66 may be formed. Next, source/drain 68 and 70 may be formed and finally silicide regions 74, 76, and 78 may be formed.

By way of example, FIG. 12 shows a dual metal gate architecture, where the n-type device has a metal gate with a work function near the silicon conduction band edge and the p-type device has a metal gate with a work function near the silicon valence band edge.

Figure 13:
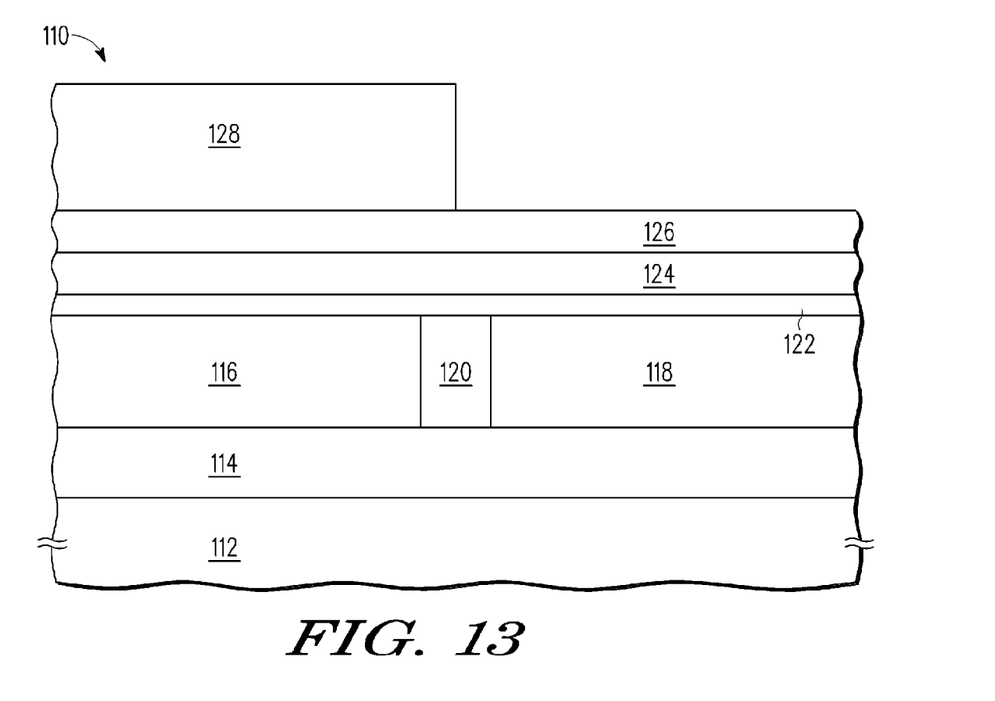
FIG. 13 is a view of a semiconductor device during a processing step.

FIGS. 13-21 show an alternative process for forming a semiconductor device 110. As shown in FIG. 13, the steps up to depositing photo resist layer 128 may be identical to the process discussed above with respect to FIGS. 1-4. In particular, by way of example, FIG. 13 shows a view of a semiconductor device 110 during a processing step. Semiconductor device 110 may comprise a device formed using semiconductor material on a buried oxide layer (BOX) 114, over a substrate 112. The semiconductor material described herein can be any semiconductor material or combinations of materials, such as gallium arsenide, silicon germanium, silicon, the like, and combinations of the above. Semiconductor device 110 may further comprise a first semiconductor layer 116 and a second semiconductor layer 118. First semiconductor layer 116 may be doped to form a p-type layer and second semiconductor layer 118 to form an n-type layer. First and second semiconductor layers 116 and 118 may be separated from each other using an isolation region 120. As a first step, a dielectric layer 122 may be formed over first semiconductor layer 16 and second semiconductor layer 118. Dielectric layer 122 may be deposited using a chemical vapor deposition or a physical vapor deposition process. Dielectric layer 122 may be a high-k dielectric layer formed using oxides of hafnium, aluminum, molybdenum, titanium, tantalum, or any other suitable element. Dielectric layer 122 may also be a thermally grown or a deposited silicon oxide layer. Dielectric layer 122 may also contain nitrogen. Dielectric layer 122 may also be a combination of a thermally grown silicon oxide layer and a deposited high-k dielectric layer. Dielectric layer 122 may have a thickness in a range of 1 to 5 nanometers. Next, a first metal layer 124 may be formed over dielectric layer 122. First metal layer 124 may comprise tantalum, titanium, molybdenum, aluminum, zirconium, silicon, or any other suitable material. By way of example, first metal layer 124 may be a compound of any of these elements and nitrogen, carbon, or boron. First metal layer 124 may be deposited using a chemical vapor deposition or a physical vapor deposition process. First metal layer 124 may have a thickness in a range of 1 to 20 nanometers. First metal layer 124 may have a work function near the silicon conduction band edge. Next, a hard mask layer 126 may be formed over first metal layer 124. Hard mask layer 126 may comprise silicon, silicon nitride, silicon oxide, metal, or any other suitable material. Hard mask layer 126 may be deposited using a chemical vapor deposition or a physical vapor deposition process. Hard mask layer 126 may have a thickness in a range of 1 to 20 nanometers. Next, a photo resist layer 128 may be formed over a portion of hard mask layer 126. By way of example, photo resist layer 128 may cover an n-type device region only.

Figure 14:
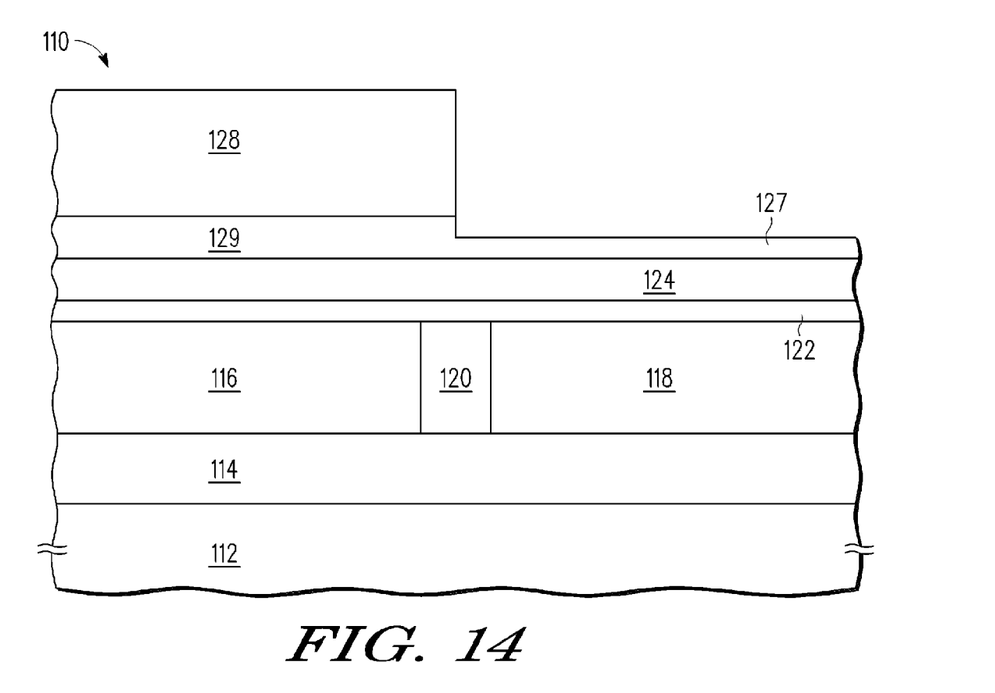
FIG. 14 is a view of a semiconductor device during a processing step.

Next, as shown in FIG. 14, a portion of hard mask layer 126 may be removed using a wet or dry etch process. This step would leave a remaining portion 127 of hard mask layer 126 and an un-etched portion 129 of hard mask layer 126. Remaining portion 127 of hard mask layer 126 may be in a region corresponding to a p-type device, for example. Un-etched portion 129 of hard mask layer 126 may be in a region corresponding to an n-type device.

Figure 15:
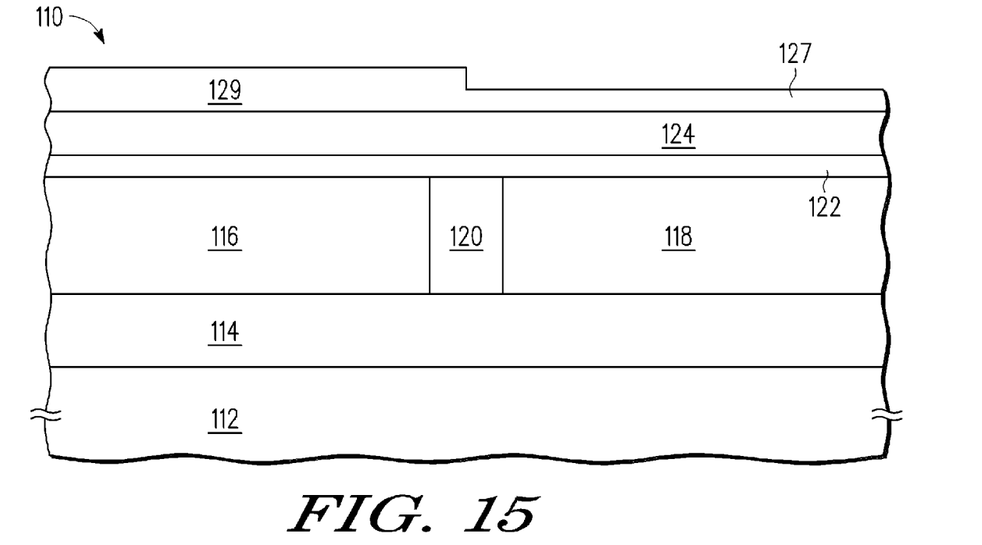
FIG. 15 is a view of a semiconductor device during a processing step.

Next, as shown in FIG. 15, photo resist layer 128 may be removed using either a wet etch or an ash etch process. This would expose un-etched portion 129 of hard mask layer 126. Remaining portion 127 of hard mask layer 126 protects first metal layer 124 from damage during the photo resist removal process. In particular, the presence of remaining portion 127 of hard mask layer 126 prevents first metal layer 124 from being exposed to photo resist removal chemistry.

Figure 16:
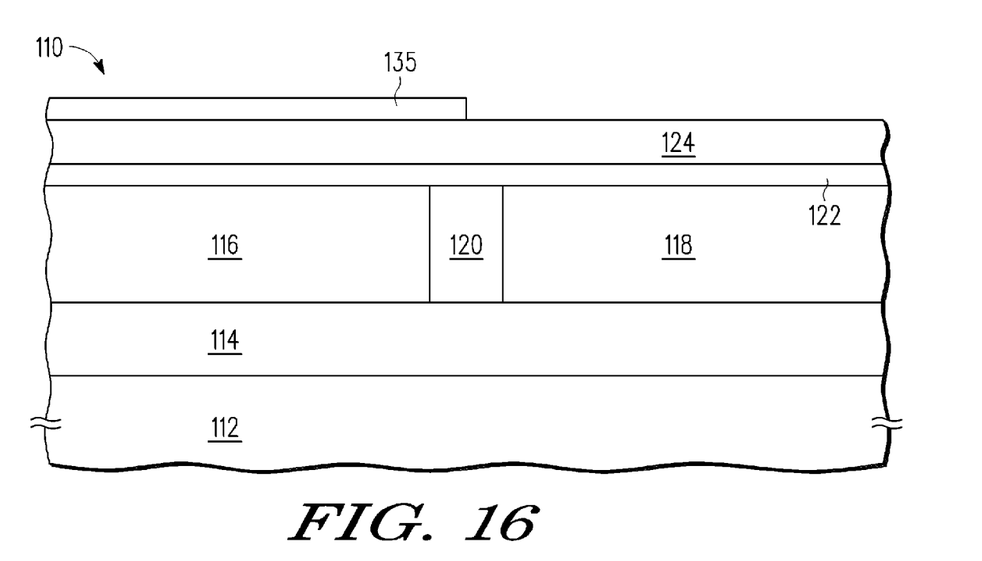
FIG. 16 is a view of a semiconductor device during a processing step.

Next, as shown in FIG. 16, the remaining portion 127 of hard mask layer 126 may be removed using a wet or dry etch process. This step would also remove a portion of un-etched portion 129 of hard mask layer 126, leaving portion 135 of hard mask layer 126. Portion 135 of hard mask layer 126 may overlie first metal layer 124 in the n-type device region, whereas first metal layer 124 in n-type device region may be exposed as a result of this step.

Figure 17:
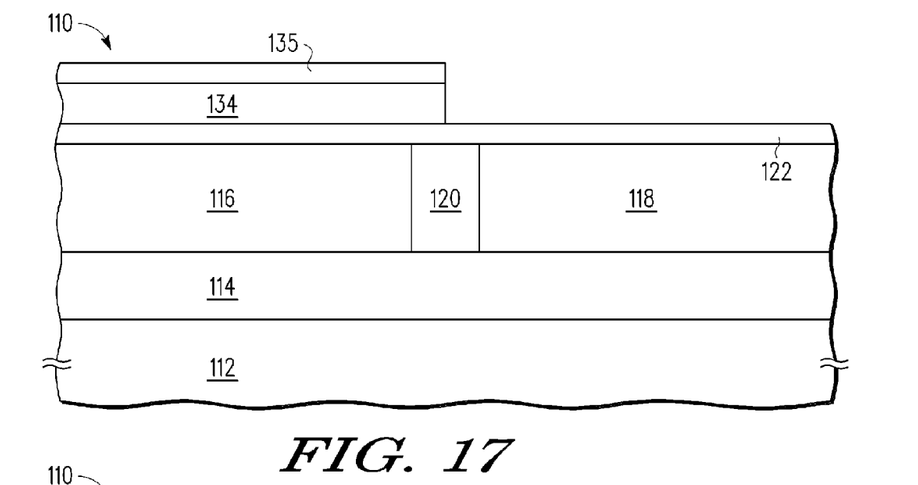
FIG. 17 is a view of a semiconductor device during a processing step.

Next, as shown in FIG. 17, a portion of first metal layer 124 that is now exposed may be removed using a wet or dry etch process. Thus, a portion 134 of first metal layer 124 may remain, which is protected by portion 135 of hard mask layer 126.

Figure 18:
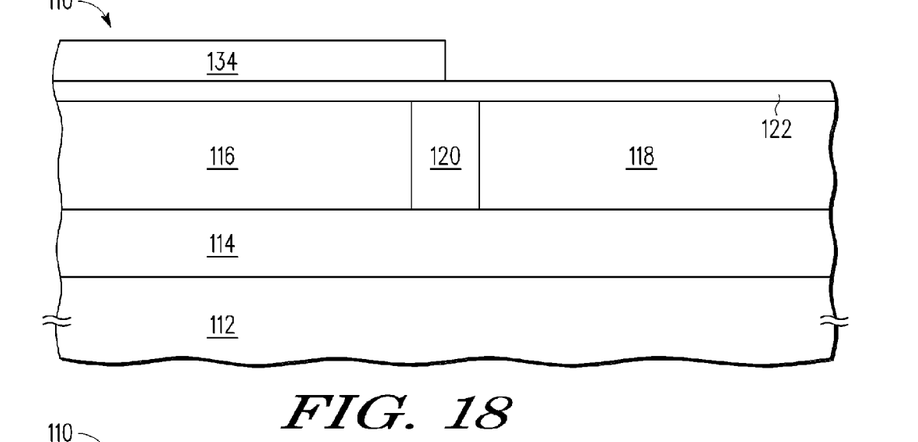
FIG. 18 is a view of a semiconductor device during a processing step.

Next, as shown in FIG. 18, portion 135 of hard mask layer 126 may be removed using a wet or dry etch process. Note that portion 135 of hard mask layer 126 may not be completely removed or may not be removed at all in the n-type device region.

Figure 19:
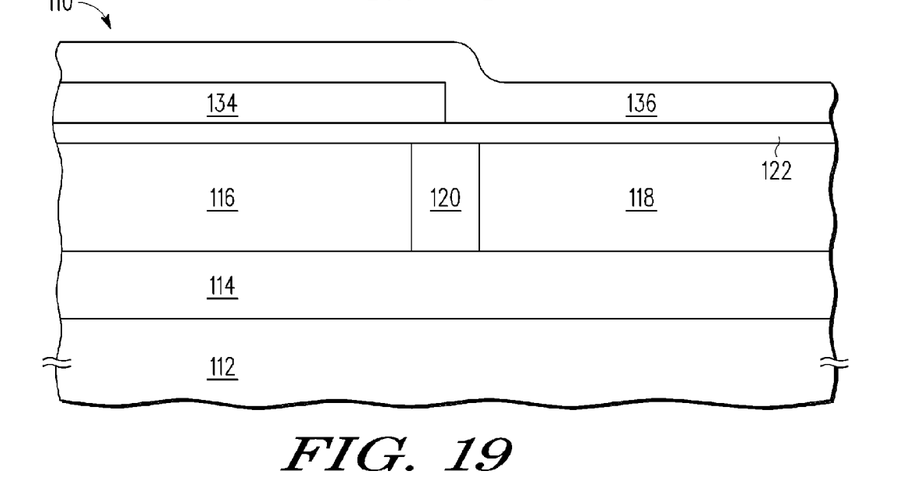
FIG. 19 is a view of a semiconductor device during a processing step.

Next, as shown in FIG. 19, a second metal layer 136 may be formed over portion 134 and an exposed portion of dielectric layer 122. Second metal layer 136 may comprise tantalum, titanium, molybdenum, aluminum, or any other suitable material. By way of example, second metal layer 136 may be a compound of any of these elements and nitrogen, carbon, oxygen, or boron. Second metal layer 136 may be deposited using a chemical vapor deposition or a physical vapor deposition process. Second metal layer 136 may have a thickness in a range of 1 to 20 nanometers. Second metal layer 136 may have a work function near the silicon valence band edge.

Figure 20:
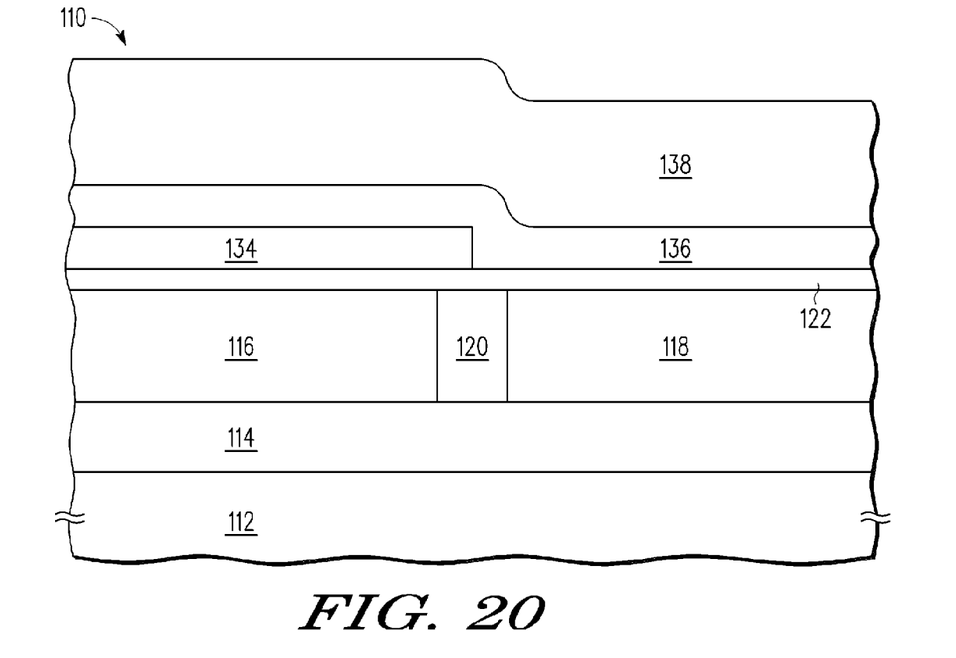
FIG. 20 is a view of a semiconductor device during a processing step.

Next, as shown in FIG. 20, a crystalline (poly) silicon layer 138 may be deposited over second metal layer 136. Crystalline silicon layer 138 may be deposited using a chemical vapor deposition or a physical vapor deposition process. In an alternative embodiment, layer 138 may be an amorphous silicon layer. Crystalline silicon layer 138 may have a thickness in a range of 50 to 100 nanometers.

Figure 21:
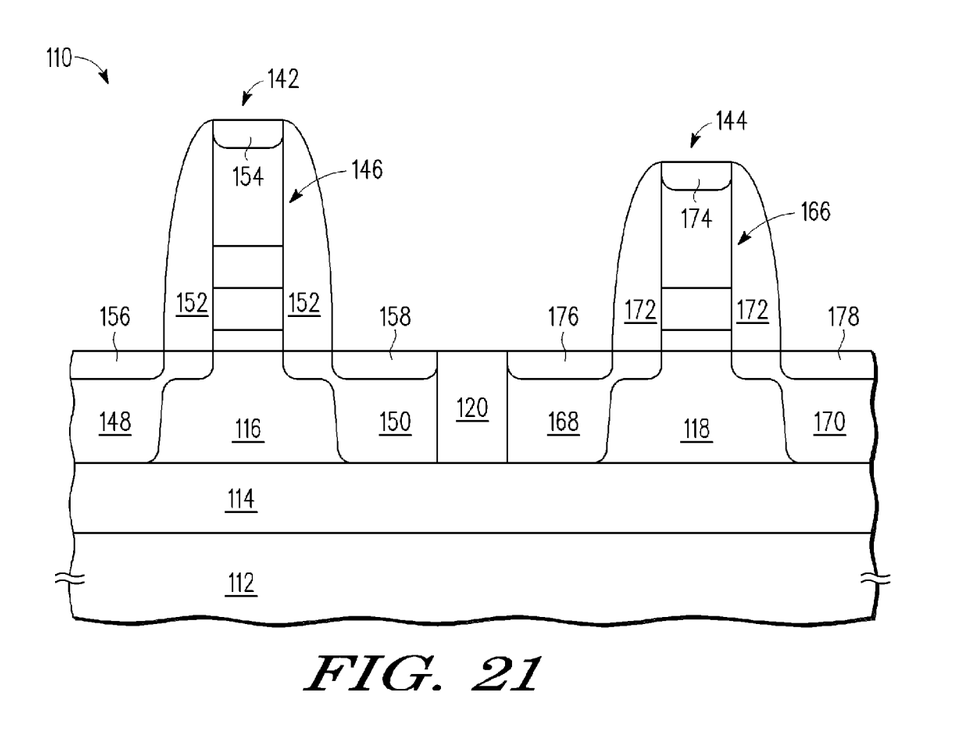
FIG. 21 is a view of a semiconductor device during a processing step.

Next, as shown in FIG. 21, additional processing steps may be performed, as needed, to form semiconductor device 110. By way of example, gate stacks 146 and 166 may be formed. Gate stack 146 may correspond to an n-type device and gate stack 166 may correspond to a p-type device. The conductivity type of these devices is merely exemplary. Next, source/drain extensions 156 and 158 for the n-type device may be formed. Next, a spacer 152 adjacent to gate stack 146 may be formed. Next, source/drain 148 and 150 may be formed and finally suicide regions 154, 156, and 158 may be formed. Similarly, source/drain extensions 176 and 178 for the p-type device may be formed. Next, a spacer 172 adjacent to gate stack 166 may be formed. Next, source/drain 168 and 170 may be formed and finally silicide regions 174, 176, and 178 may be formed.

By way of example, FIG. 21 shows a dual metal gate architecture, where the n-type device has a metal gate with a work function near the silicon conduction band edge and the p-type device has a metal gate with a work function near the silicon valence band edge.

Although the invention has been described with respect to specific conductivity types or polarity of potentials, skilled artisans appreciate that conductivity types and polarities of potentials may be reversed. In addition, although the above embodiments are discussed in terms of removal of various layers, removal does not necessarily mean a complete removal of that layer. In other words, a very small portion of the layer being removed may still be present. The presence of such small portions, however, may not affect the electrical characteristics of the semiconductor device.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor device, the method comprising:
   forming a dielectric layer;
   partially etching a first portion of a first layer overlying the dielectric layer, wherein:
      the first layer is a conductive layer;
      the first portion comprises a top portion and a bottom portion under the top portion; and
      partially etching comprises removing the top portion of the first portion while the bottom portion of the first portion remains;
   removing at least a portion of a second layer;
   after removing the at least a portion of the second layer, completing etching of the first portion of the first layer so that the bottom portion of the conductive layer is removed after removing at least the portion of the second layer;
   forming a third layer in direct contact with the dielectric layer after completely etching the first portion of the first layer, wherein the third layer is another conductive layer; and
   completing formation of the semiconductor device, wherein portions of the dielectric layer and the third layer are parts of a transistor.

2. A method as in claim 1, wherein the second layer comprises a hard mask.

3. A method as in claim 1, wherein the conductive layer comprises a metal.

4. A method as in claim 3, wherein the metal comprises at least one of a group consisting of tantalum, titanium, molybdenum, tungsten, zirconium, hafnium, platinum, and magnesium.

5. A method as in claim 1, wherein the conductive layer comprises at least a compound, wherein the compound comprises at least one of a group consisting of oxygen, nitrogen, carbon, and boron.

6. A method as in claim 1, wherein the step of partially etching the conductive layer comprises a step of using a dry etch to partially etch the conductive layer.

7. A method as in claim 1, wherein the step of partially etching the conductive layer comprises a step of using a wet etch to partially etch the conductive layer.

8. A method as in claim 1, wherein the step of completing etching of the conductive layer comprises a step of using a wet etch to compete etching of the conductive layer.

9. A method as in claim 1, further comprising forming the hard mask, wherein forming the hard mask further comprises:
   forming the second layer;
   forming a patterned resist layer over the second layer; and
   removing part of the second layer to form the hard mask.

10. A method as in claim 9, further comprising removing the patterned resist layer before partially etching the first portion of the first layer.

11. A method as in claim 1, wherein the second layer comprises silicon, silicon nitride, or a metal.

12. A method as in claim 1, wherein:
   the first layer has a work function closer to a silicon conduction band as compared to the third layer; and
   the third layer has a work function closer to a silicon valence band as compared to the first layer.

13. A method for forming a semiconductor device, the method comprising:
   forming a first conductive layer, the first conductive layer having a first portion and a second portion;
   forming a hard mask overlying the second portion of the first conductive layer;
   partially etching the first portion of the first conductive layer which is exposed through the hard mask;
   removing the hard mask;
   after removing the hard mask, completing etching of the first portion of the conductive layer so that the first portion of the conductive layer is removed;
   forming a second conductive layer, wherein at least a portion of the second conductive layer is used in a gate stack of the semiconductor device; and
   completing formation of the semiconductor device.

14. A method as in claim 13, wherein said step of completing etching of the first portion of the conductive layer comprises partially etching the second portion of the conductive layer.

15. A method as in claim 13, wherein the gate stack comprises at least a portion of the second portion of the first conductive layer.

16. A method as in claim 13, wherein a thickness of the first conductive layer is in a range of 1-20 nanometers.

17. A method as in claim 13, wherein forming the hard mask further comprises:
   forming a hard mask layer;

forming a patterned resist layer over the hard mask layer; and removing a portion of the hard mask layer to form the hard mask.

18. A method as in claim 17, further comprising removing the patterned resist layer before partially etching the first portion of the first conductive layer.

19. A method as in claim 13, wherein the hard mask comprises silicon, silicon nitride, or a metal.

20. A method as in claim 13, further comprising forming a gate dielectric layer before forming the first conductive layer, wherein:
- the gate dielectric layer is not exposed when removing the hard mask; and
- a portion of the gate dielectric layer that is not covered by the hard mask during partially etching is part of a transistor after completing formation of the semiconductor device.

* * * * *